US009548428B2

(12) United States Patent
Sheng et al.

(10) Patent No.: US 9,548,428 B2
(45) Date of Patent: *Jan. 17, 2017

(54) LIGHT-EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Cuicui Sheng, Xiamen (CN); Shuying Qiu, Xiamen (CN); Chaoyu Wu, Xiamen (CN); Ching-Shan Tao, Xiamen (CN); Wenbi Cai, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/886,017

(22) Filed: Oct. 17, 2015

(65) Prior Publication Data

US 2016/0049557 A1 Feb. 18, 2016

Related U.S. Application Data

(63) Continuation of application No. 14/710,544, filed on May 12, 2015, now Pat. No. 9,184,356, which is a (Continued)

(30) Foreign Application Priority Data

Mar. 7, 2013 (CN) .......................... 2013 1 0071915

(51) Int. Cl.
*H01L 33/46* (2010.01)
*H01L 33/00* (2010.01)
(Continued)

(52) U.S. Cl.
CPC ........... *H01L 33/46* (2013.01); *H01L 25/0753* (2013.01); *H01L 33/0062* (2013.01); *H01L 33/10* (2013.01);
(Continued)

(58) Field of Classification Search
None
See application file for complete search history.

(56) References Cited

U.S. PATENT DOCUMENTS 5,627,851 A * 5/1997 Takahashi ............. H01S 5/0207
372/108
8,405,068 B2 * 3/2013 O'Keefe ................. H01L 27/15
257/15

(Continued)

*Primary Examiner* — William Coleman
*Assistant Examiner* — Kien Ly
(74) *Attorney, Agent, or Firm* — Syncoda LLC; Feng Ma; Junjie Feng

(57) ABSTRACT

A light emitting diode includes: a substrate of front and back main surfaces; a V-shaped groove, which has a reflecting surface, formed over front surface of the conductive substrate; a light-emitting epitaxial layer, the margin of which has its vertical projection between the bottom and the inner margin of the V-shaped groove, formed over the substrate, so that light emitted from the light-emitting epitaxial layer margin is incident to the mirror surface of the V-shaped groove and emits outwards. This structure can effectively improve extraction efficiency of device and control path of light at peripheral region of the light-emitting epitaxial layer.

19 Claims, 9 Drawing Sheets

Related U.S. Application Data continuation of application No. PCT/CN2014/070975, filed on Jan. 21, 2014.

(51) Int. Cl.
    *H01L 33/20*     (2010.01)
    *H01L 33/60*     (2010.01)
    *H01L 25/075*     (2006.01)
    *H01L 33/10*     (2010.01)

(52) U.S. Cl.
    CPC .............. *H01L 33/20* (2013.01); *H01L 33/60* (2013.01); *H01L 33/0079* (2013.01); *H01L 2924/0002* (2013.01); *H01L 2933/0025* (2013.01); *H01L 2933/0058* (2013.01)

(56) References Cited

U.S. PATENT DOCUMENTS

| | | | | |
|---|---|---|---|---|
| 8,664,026 | B2* | 3/2014 | Tu | H01L 33/20 257/E33.064 |
| 2003/0143771 | A1* | 7/2003 | Kidoguchi | H01L 21/0237 438/46 |
| 2006/0124943 | A1* | 6/2006 | Li | H01L 33/20 257/94 |
| 2008/0048202 | A1* | 2/2008 | Tazima | H01L 27/153 257/98 |
| 2009/0272993 | A1* | 11/2009 | Cheong | H01L 33/10 257/94 |
| 2011/0012155 | A1* | 1/2011 | Huang | H01L 33/0095 257/98 |
| 2011/0127554 | A1* | 6/2011 | Lee | H01L 33/10 257/98 |
| 2012/0193664 | A1* | 8/2012 | Lin | H01L 33/20 257/98 |

* cited by examiner

LIGHT-EMITTING DIODE AND FABRICATION METHOD THEREOF

CROSS-REFERENCE TO RELATED APPLICATIONS

The present application is a continuation of, and claims priority to, U.S. patent application Ser. No. 14/710,544 filed on May 12, 2015, which is a continuation of, and claims priority to, PCT/CN2014/070975 filed on Jan. 21, 2014, which claims priority to Chinese Patent Application No. 201310071915.7 filed on Mar. 7, 2013. The disclosures of these applications are hereby incorporated by reference in their entirety.

BACKGROUND

In recent years, light emitting diodes (LEDs) has been widely applied and play a more and more important roles in various fields like display system, lighting system and automobile tail light. The LED with $(Al_xGa_{1-x})_{0.5}$ InP active area has high internal quantum efficiency. However, external quantum efficiency of traditional LED has been restricted by many factors like internal total reflection, metal electrode blocking and light absorption by GaAs semiconductor material. For those LEDs growing over light-absorption substrates, a good part of light is finally absorbed by the substrate. Therefore, for those traditional LED structures, external quantum efficiency remains low even internal photoelectric converting efficiency is high. Methods to improve LED light extraction efficiency include thinning window layer, surface roughening, transparent substrate, inverted pyramid structure, etc.

SUMMARY

The present disclosure provides a LED and fabrication method thereof, which can effectively improve extraction efficiency of device and control path of light emitted from the peripheral region of light-emitting epitaxial layer.

The present disclosure provides an LED, comprising a substrate of front and back main surfaces; a V-shaped groove, which has a reflecting surface, formed over front surface of the conductive substrate; a light-emitting epitaxial layer, the margin of which has its vertical projection between the bottom and the inner margin of the V-shaped groove, formed over the substrate, so that light emitted from the light-emitting epitaxial layer margin is incident to the mirror surface of the V-shaped groove and emits outwards.

Further, optical path of light emitted from the peripheral region of the light-emitting epitaxial layer is adjusted by the V-shaped groove.

In some embodiments, the included angle between the two side walls of the V-shaped groove structure reaches 90 degrees, so that light emitted at vertical direction is reflected by the V-shaped groove and emits at vertical direction after parallel displacement outwards.

In some embodiments, the included angle between the two side walls of the V-shaped groove structure is an obtuse angle, so that light emitted at vertical direction is reflected by the V-shaped groove and emits outwards, thereby expanding light emitting angle.

In some embodiments, a reflecting structure is formed between the substrate and the light-emitting epitaxial layer, and vertical projection of the reflecting structure is at the inner side of the V-shaped groove.

The present disclosure also provides an LED fabricating method, comprising forming a light-emitting epitaxial layer over the substrate, wherein: a V-shaped groove, which has a reflecting surface, is formed over the substrate; vertical projection of the light-emitting epitaxial layer margin is between the bottom and the inner margin of the V-shaped groove, so that light emitted from the light-emitting epitaxial layer margin is incident to the mirror surface of the V-shaped groove structure and emits outwards.

In some embodiments, a LED fabrication method, comprising: 1) providing a growth substrate, on which a light-emitting epitaxial layer is formed; 2) providing a substrate, on the front surface of which at least one V-shaped groove with a reflecting surface is formed; 3) connecting the light-emitting epitaxial layer to the substrate, so that vertical projection of the light-emitting epitaxial layer margin is at the inner side of the V-shaped groove bottom, thereby, light emitted from the light-emitting epitaxial layer margin is incident to the mirror surface of the V-shaped groove structure and emits outwards.

In some embodiments, the included angle between the two side walls of the V-shaped groove is designed as straight angle, so that light emitted from the light-emitting epitaxial layer margin at vertical direction is reflected by the V-shaped groove and emits at vertical direction after parallel displacement outwards, thus guaranteeing consistency of light emitting direction. Further, by adjusting included angles $\alpha_1$ and $\alpha_2$ between the two side walls and the level surface, the distance of horizontal displacement can be controlled. The smaller the angle is, the shorter the distance is. To ensure extraction efficiency, in general, the included angle $\alpha_1$ between the inner side wall and the level surface is less than or equals to 60° with preferred range as 30°-50° and preferred value as 45°.

In some embodiments, the included angle between the two side walls of the V-shaped groove is designed as an obtuse angle, so that light emitted from the light-emitting epitaxial layer margin at vertical direction is reflected by the V-shaped groove and emits outwards the chip. Further, by adjusting included angles $\alpha_1$ and $\alpha_2$ between the two side walls and the level surface, emitting angle, accumulation and dispersion of aforesaid light can be controlled.

The aforesaid LED can be applied in various fields like display system, lighting system and automobile tail light. In some light-emitting systems, a plurality of LEDs may be included, including various types of LEDs such as those described below.

DETAILED DESCRIPTION

References will be made to the following drawings to give clear description of the LED device structure and fabrication method, including the preferred embodiments. It is to be understood that by those skilled in the art that various changes may be made therein without influencing the beneficial effects of the present disclosure. Therefore, the descriptions below shall be understood as widely known by those skilled in the art and are not meant to limit the scope of the invention.

Figure 1:
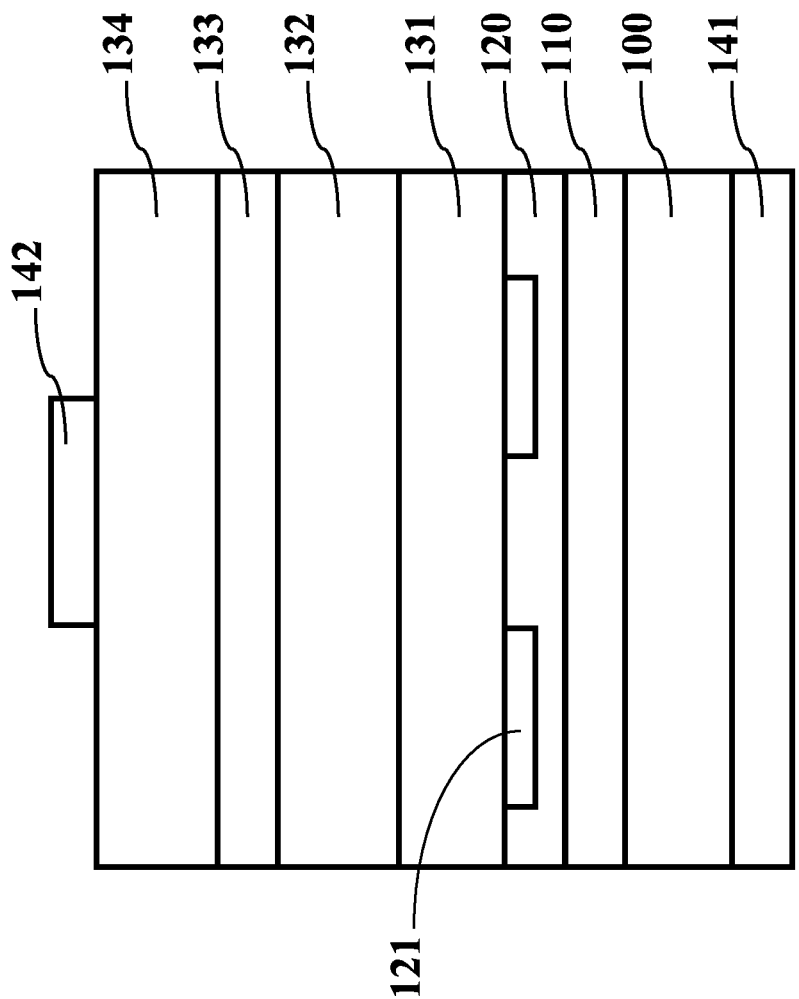
FIG. 1 is a structure diagram of an existing AlInGaP quaternary LED.

FIG. 1 discloses an AlInGaP quaternary LED of omni-directional reflector (ODR), comprising a conductive substrate (Si) 100, a bonding layer 110, an omni-directional reflector, a p-type window layer (GaP) 131, a p-type cladding layer (p-AlGaInP) 132, an active area 133, an n-type cladding layer (n-AlGaInP) 134, a P electrode 141 and an N electrode 142, in which, the omni-directional reflecting layer comprises a low-refractivity dielectric layer ($SiO_x$) 121 and a high-reflectivity metal mirror surface layer 120 thereunder.

In this LED structure, part of light emitted from the active area downwards is totally reflected by the low-refractivity dielectric layer ($SiO_x$) and part of light is totally reflected by the high-reflectivity metal mirror surface layer, thus increasing light-emitting efficiency. However, after light emitted from the active area downwards is reflected by the omni-directional reflecting (ODR) layer, it is partially absorbed by the active area, thus influencing light-emitting efficiency.

In the LED structure disclosed by embodiments below, light absorption probability by the active area after direct reflection can be reduced, thus increasing light emitting efficiency and controlling path of light emitted from the peripheral region of the light-emitting epitaxial layer.

Figure 2:
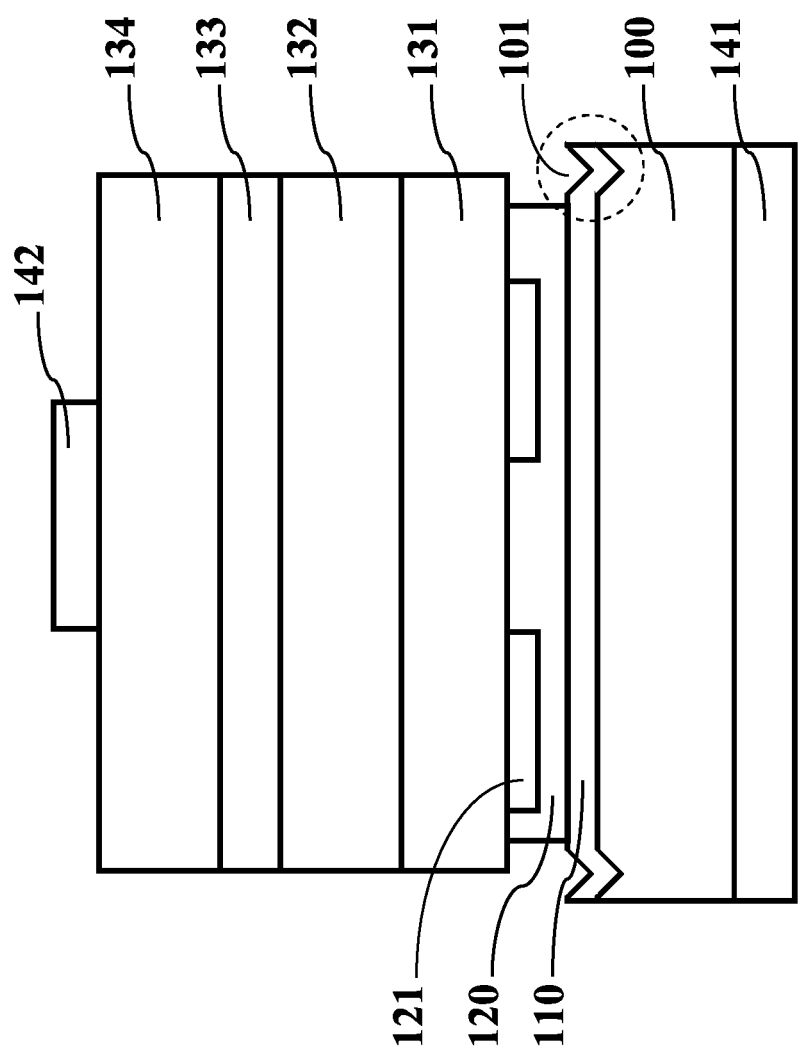
FIG. 2 is a structure diagram of an LED according to some embodiments of the present disclosure.

With reference to FIG. 2, on the basis of light emitting device as shown in FIG. 1, a V-shaped groove structure 101 with a mirror surface is designed surrounding the high-reflectivity metal mirror surface layer 120 under the active area 133 and above the conductive substrate (Si) 100, so that light emitted from the active area is incident to the mirror surface of the V-shaped groove structure. As optical path is adjusted by the mirror surface of the V-shaped groove, light absorption probability by the active area after direct reflection is reduced and the light-emitting efficiency is increased.

As shown in FIG. 2, the structure diagram of LED, an omni-directional reflector is arranged between the light-emitting epitaxial layer and the substrate, which is one of preferred embodiments of the present disclosure. Such alterations and modifications as elimination of reflector structure or substitution with Ag/Al reflector, distributed Bragg reflector or other reflector structures can be made by those skilled in the art on the basis of specific device structure. If no reflector structure is arranged between the light-emitting epitaxial layer and the substrate, it is preferable that: the contact surface between the light-emitting epitaxial layer and the substrate is at inner side of the inner side margin of the V-shaped groove structure. More preferably, the contact surface of the light-emitting epitaxial layer and the substrate is at inner side of the inner side margin of V-shaped groove structure and the bottom margin of the light-emitting epitaxial layer has certain height from such contact surface.

Figure 3:
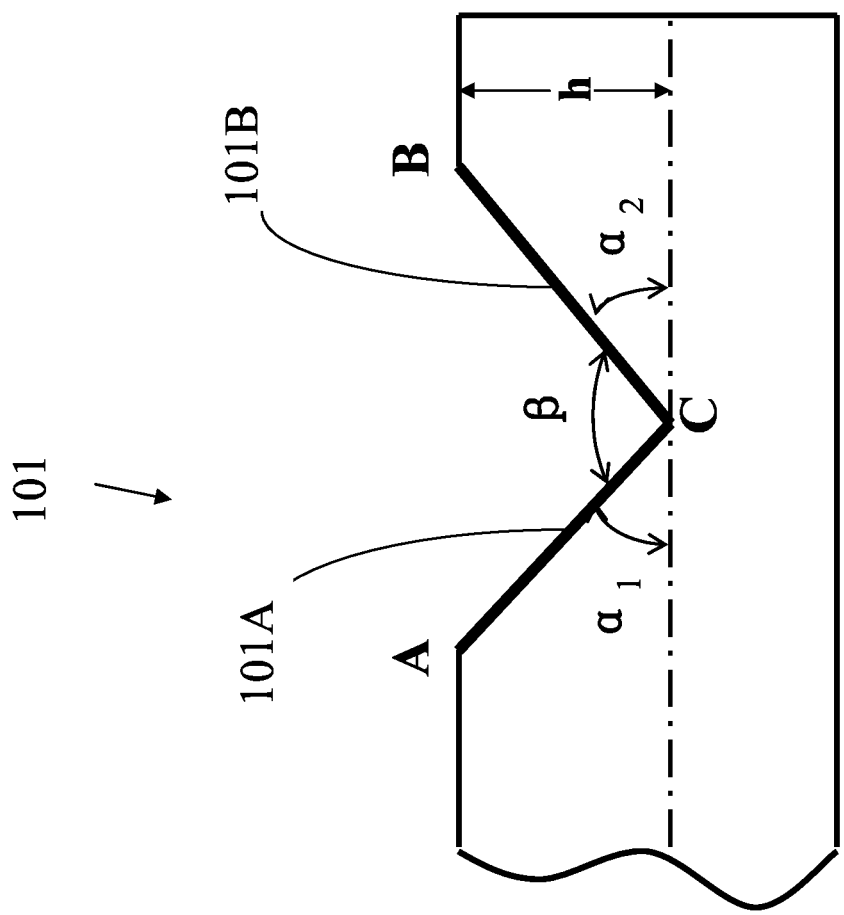
FIG. 3 is a partial enlarged drawing of the V-shaped groove structure for LED as shown in FIG. 2.

With reference to FIG. 3, the V-shaped groove 101 bottom is set as C, the inner side margin as A, the outer side margin as B, the inner side wall as 101A and the outer side wall as 101B, wherein, the included angle between the inner side wall 101A and the level surface as $\alpha_1$, the included angle between the outer side wall 101B and the level surface as $\alpha_2$, and the included angle between both side walls as $\beta$. Depth h of the V-shaped groove is determined on the basis of cutting passage width of the device, which is about 5-20 μm, and preferably about 15 μm.

In embodiments below, optical path of light emitted from the peripheral region of the light-emitting epitaxial layer is adjusted by the V-shaped groove. If required, light emitting types of device can be controlled by adjusting various included angles of the V-shaped groove.

Figure 4:
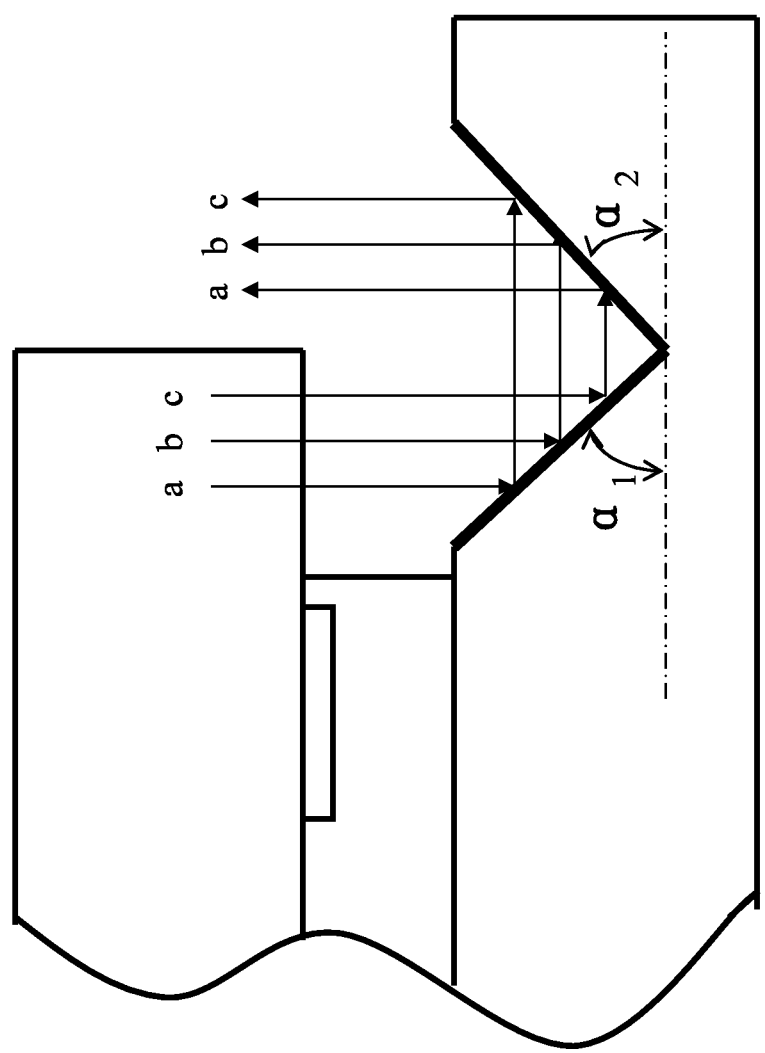
FIG. 4 illustrates paths of light emitted from the light-emitting epitaxial layer margin at vertical direction corresponding to the V-shaped groove structure.
Figure 5:
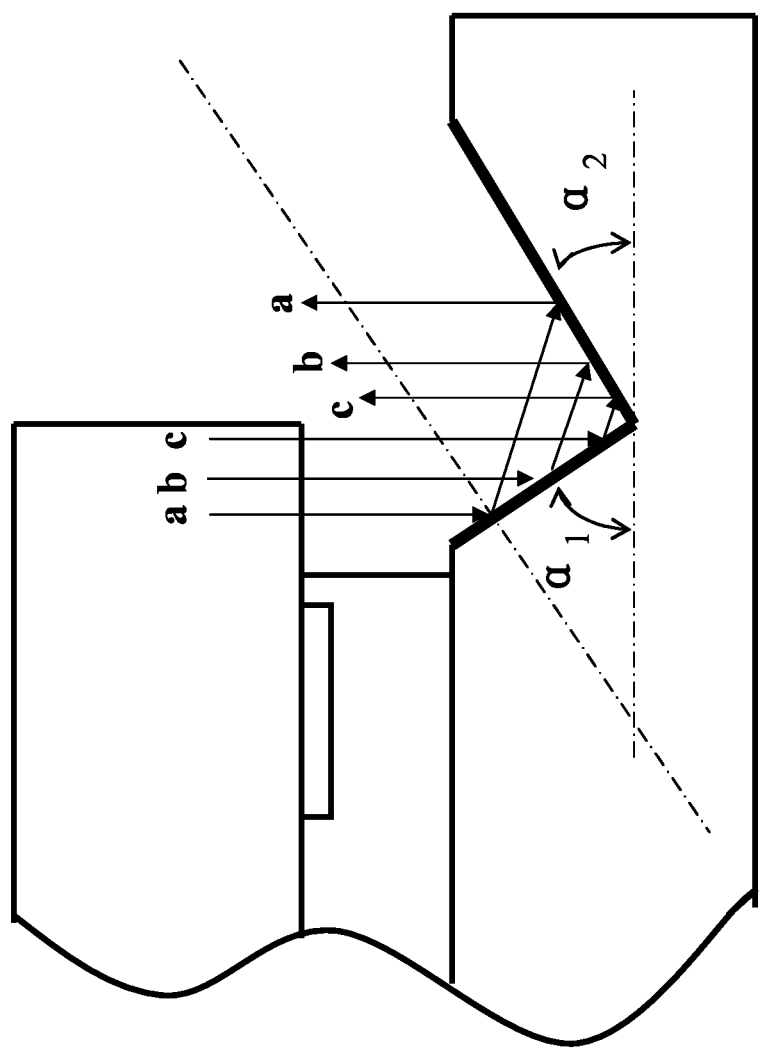
FIG. 5 illustrates some other paths of light.

With reference to FIGS. 4 and 5, where $\beta$ is a straight angle, light emitted from the light-emitting epitaxial layer margin at vertical direction is reflected by the V-shaped groove and emits at vertical direction after parallel displacement outwards, thus guaranteeing consistency of light emitting direction. The horizontal displacement distance can be controlled by adjusting $\alpha_1$ and $\alpha_2$. The smaller $\alpha_1$ is, the shorter the displacement distance is. To ensure extraction efficiency, in general, $\alpha_1$ is less than or equals to 60°, with preferred range as 30°-50° and preferred value as 45°.

Figure 6:
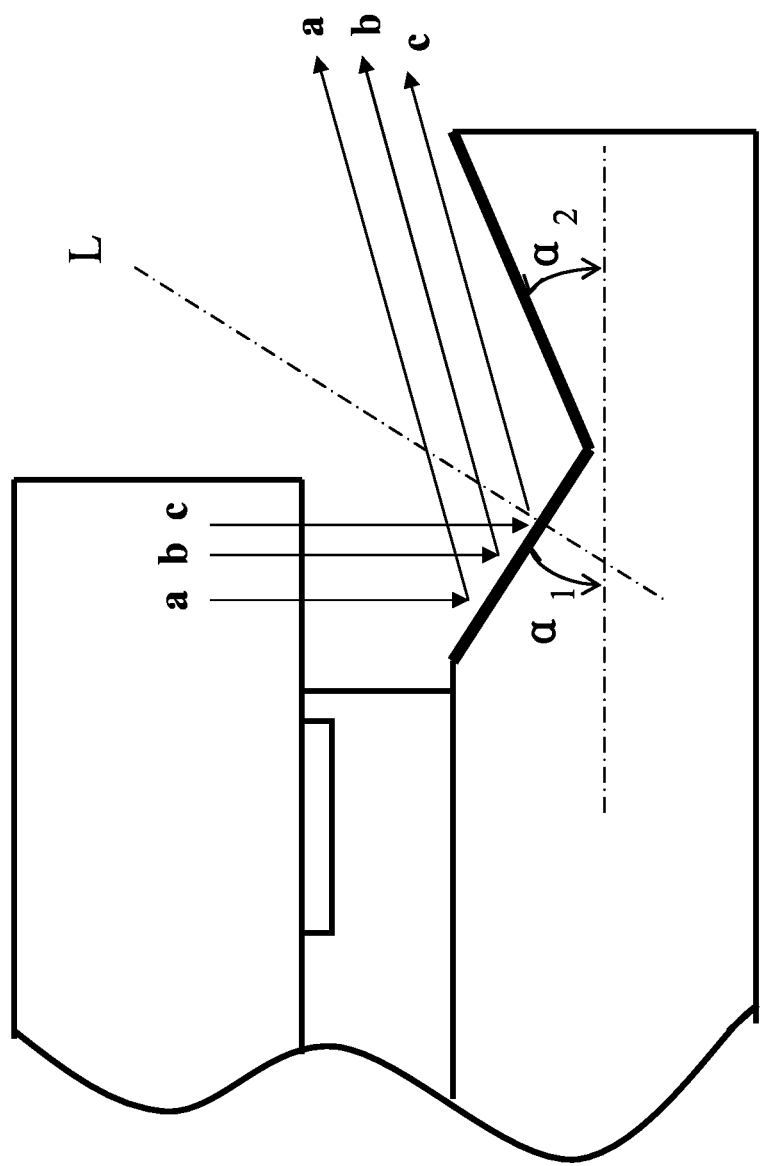
FIG. 6 illustrates some other paths of light.
Figure 7:
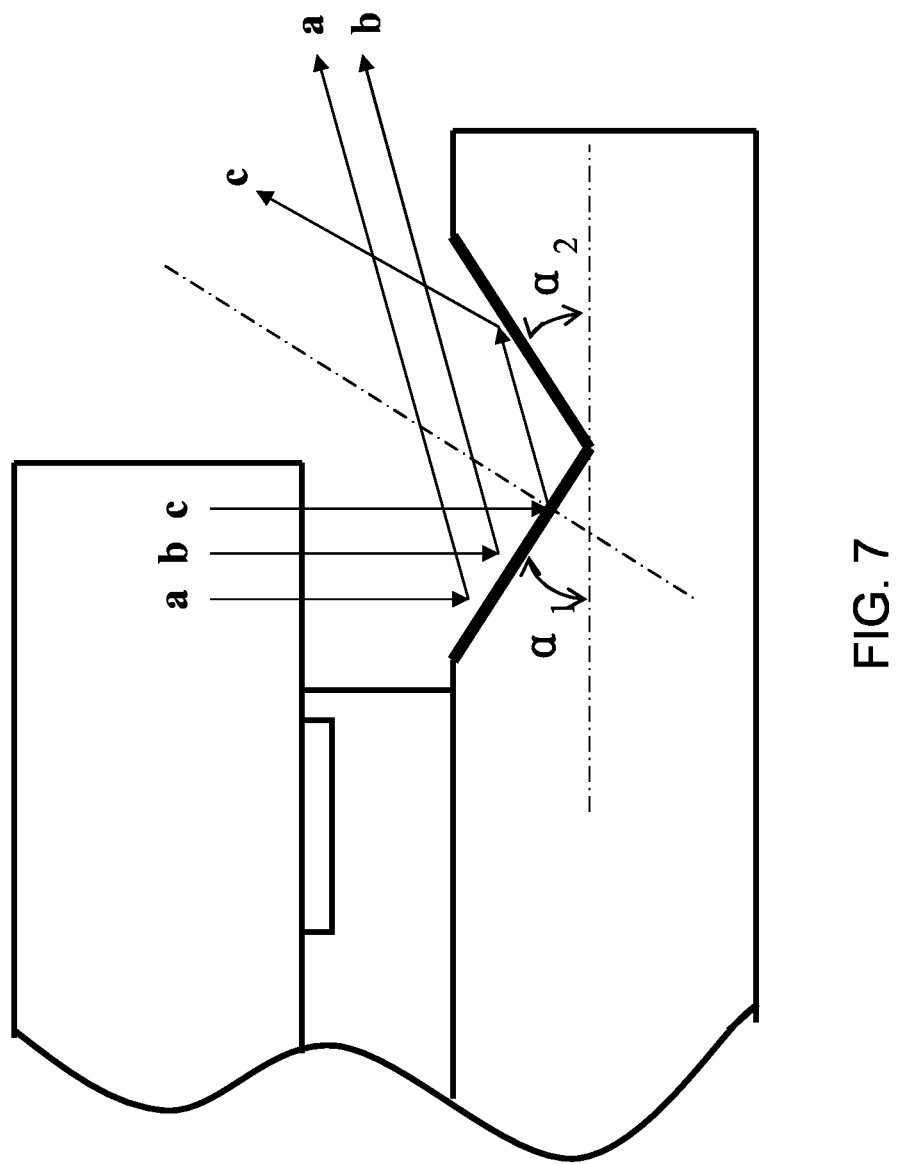
FIG. 7 illustrates yet other paths of light as adjusted.

With reference to FIGS. 6 and 7, where $\beta$ is an obtuse angle, light emitted from the light-emitting epitaxial layer margin at vertical direction is reflected by the V-shaped groove and emits outwards the chip. By adjusting included angles $\alpha_1$ and $\alpha_2$, emitting angle, accumulation and dispersion of aforesaid light can be controlled. FIG. 6 shows optical path of an embodiment. In this embodiment, $45°>\alpha_1>\alpha_2$. Light emitted from the light-emitting epitaxial layer margin at vertical direction, after being reflected by the inner side wall 101A of the V-shaped groove, directly emits outwards, thus guaranteeing consistency of light emitting and effectively expanding light emitting angle of devices. FIG. 7 shows optical path of another embodiment. In this embodiment, $45°>\alpha_1=\alpha_2$, part of light emitted from the peripheral region of the light-emitting epitaxial layer at vertical direction is directly reflected by the inner side wall 101A of the V-shaped groove and part of light, after second reflection by the outer side wall 101B of the V-shaped groove, emits inclined upwards, which is suitable for astigmatic light-emitting device (e.g., back light source).

Specific embodiments are given above to illustrate how to control path of light emitted from the peripheral region of the light-emitting epitaxial layer at vertical direction by adjusting shapes of the V-shaped groove (e.g., angle and depth of the V-shaped groove). However, the above embodiments are to be considered as illustrative and not restrictive to the present disclosure. Various alterations or modifications within the spirits and concepts of the present disclosure can be made by those skilled in the art.

The aforesaid LED can be obtained through the following methods.

A first step is epitaxial growth. Provide a growth substrate and grow an n-type cladding layer 134 over the growth substrate through epitaxial growth. In some embodiments, selectively form an n-type contact layer over the growth substrate surface and grow an n-type cladding layer over the n-type contact layer through epitaxial growth to improve device electricity quality. In some embodiments, selectively deposit an etching stop layer over the growth substrate surface and grow an n-type contact layer and an n-type cladding layer in successive over the etching stop layer for the convenience of further removal of the growth substrate. Grow an active area 133, which can be a multiple quantum well (MQW), over the n-type cladding layer 134 through epitaxial growth. Grow a p-type cladding layer 132 and a P-GaP window layer 131 over the active area to complete epitaxial growth.

Figure 8:
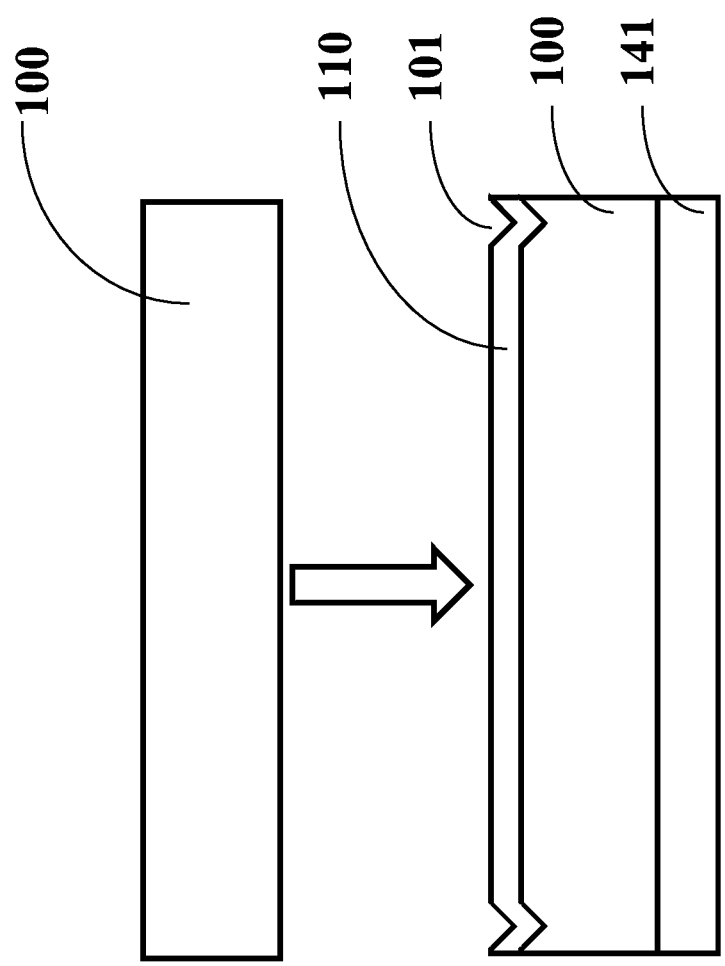
FIG. 8 is a first sectional view illustrating a fabrication process for the LED shown in FIG. 2.
Figure 9:
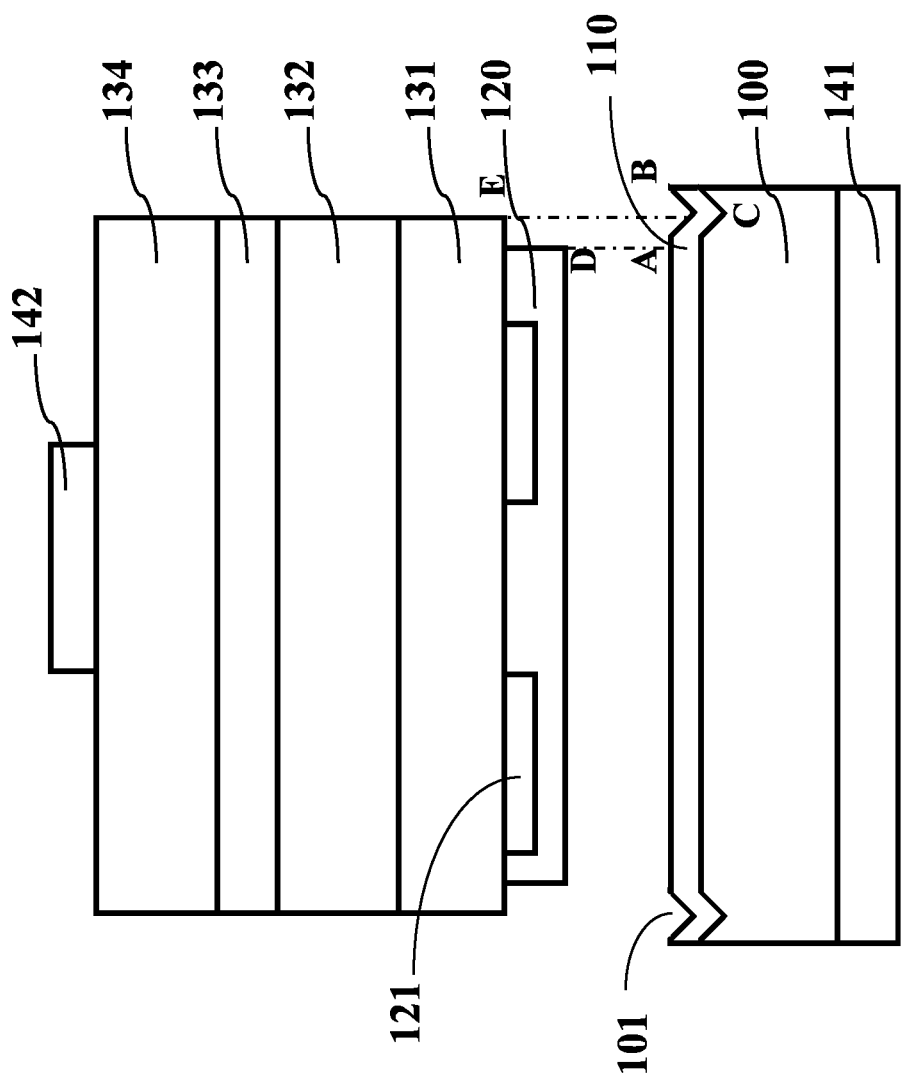
FIG. 9 is a second sectional view.

The next step is to provide a conductive silicon substrate 100. As shown in FIG. 8, etch the Si-conductive substrate into a V-shaped groove structure 101 with Si etchant; evaporate Au 110 of certain thickness over the conductive substrate surface for bonding and mirror reflecting; and fabricate a P electrode 141 over the back surface of the conductive substrate.

Fabricate a reflector over surface of the P-GaP window layer 131. Specifically, evaporate a low-refractivity dielectric layer ($SiO_x$) 121; remove part of the low-refractivity dielectric layer through mask etching to form a conductive channel; evaporate a thick layer of Au 120 over the low-refractivity dielectric layer ($SiO_x$) as the high-reflectivity metal mirror surface layer, which fills in the conductive channel; etch a thick Au margin of the mirror surface under the P-GaP through photo etching, so that the margin D of the high-reflectivity metal mirror surface layer at the inner side of the inner side margin A of the V-shaped groove 101 to avoid reflection of light emitted from the light emitting layer margin by the mirror surface and absorption by the quantum well; at the same time, the margin E of the P-cladding layer 131 is at the inner side of the outer side margin B of the V-shaped groove bottom to avoid reflection of light emitted from the light emitting layer margin by the V-shaped groove; the light beam translates towards the inner side and the light is absorbed by the quantum well after being reflected back in upward direction.

Lastly, bond the conductive substrate (Si) with a V-shaped groove structure to the epitaxial layer; remove the growth substrate and fabricate the n electrode 142 to form a high-light LED structure.

The LEDs disclosed in aforesaid embodiments can be applied in various fields like display system, lighting system and automobile tail light.

The aforesaid embodiments take the quaternary LED structures as examples for illustration. It is to be understood that the present disclosure is not restricted to quaternary LED but expandable to GaN-based LEDs, like blue-light, green-light or purple-light LEDs.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method of fabricating a light-emitting diode, the method comprising:
   forming a light-emitting epitaxial layer over a substrate; and
   forming at least one V-shaped groove having a reflecting surface over the substrate;
   wherein a vertical projection of a peripheral region of the light-emitting epitaxial layer margin is between a bottom and an inner side portion of the V-shaped groove such that light emitted from the light-emitting epitaxial layer margin is incident upon the reflecting surface of the V-shaped groove structure and reflected outwards.

2. The method of claim 1, wherein the V-shaped groove is formed at a front surface of the substrate, and wherein said projection is formed by coupling the light-emitting epitaxial layer to the substrate.

3. The method of claim 2, wherein an angle between two side walls of the V-shaped groove is about 90 degrees such that light emitted at a vertical direction is reflected by the V-shaped groove and emits vertically after a parallel displacement outwards.

4. The method of claim 2, wherein an angle between two side walls of the V-shaped groove formed is an obtuse angle such that light emitted at a vertical direction is reflected by the V-shaped groove and emits outwards, thereby expanding a light emitting angle.

5. The method of claim 2, further comprising forming a reflecting structure between the light-emitting epitaxial layer and the substrate, wherein a vertical projection of the reflecting structure is at an inner side of the V-shaped groove.

6. A light-emitting diode formed using a method comprising:
   forming a light-emitting epitaxial layer over a substrate; and
   forming at least one V-shaped groove having a reflecting surface over the substrate;
   wherein a vertical projection of a peripheral region of the light-emitting epitaxial layer margin is between a bottom and an inner side portion of the V-shaped groove such that light emitted from the light-emitting epitaxial layer margin is incident upon the reflecting surface of the V-shaped groove structure and reflected outwards,
   the light-emitting diode comprising:
   the substrate having front and back main surfaces, and the at least one V-shaped groove having the reflecting surface formed over the front main surface of the substrate;
   the light-emitting epitaxial layer over the substrate, wherein the peripheral region of the light-emitting epitaxial layer has the vertical projection between a bottom and an inner portion of the V-shaped groove, such that light emitted from the light-emitting epitaxial layer peripheral region is incident upon the reflecting surface of the V-shaped groove and reflected outwards.

7. The light-emitting diode of claim 6, wherein an optical path of the light emitted from the peripheral region of the light-emitting epitaxial layer is adjusted by the V-shaped groove.

8. The light-emitting diode of claim 7, wherein an angle between two side walls of the V-shaped groove is about 90 degrees such that light emitted at a vertical direction is reflected by the V-shaped groove and emits vertically after a parallel displacement outwards.

9. The light-emitting diode of claim 8, wherein: the V-shaped groove has a depth of about 5-20 μm.

10. The light-emitting diode of claim 7 wherein an angle between two side walls of the V-shaped groove is an obtuse angle such that light emitted at a vertical direction is reflected by the V-shaped groove and emits outwards, thereby expanding a light emitting angle.

11. The light-emitting diode of claim 6, wherein a reflecting structure is formed between the substrate and the light-emitting epitaxial layer, and wherein a vertical projection of the reflecting structure is at an inner side of the V-shaped groove.

12. The light-emitting diode of claim 11, wherein the reflecting structure is an omni-directional reflector comprising a low-refractivity dielectric layer and a metal reflecting layer.

13. A light-emitting system comprising a plurality of LEDs, wherein each LED is formed using a method comprising:

forming a light-emitting epitaxial layer over a substrate; and forming at least one V-shaped groove having a reflecting surface over the substrate;

wherein a vertical projection of a peripheral region of the light-emitting epitaxial layer margin is between a bottom and an inner side portion of the V-shaped groove such that light emitted from the light-emitting epitaxial layer margin is incident upon the reflecting surface of the V-shaped groove structure and reflected outwards, the LED comprising:

the substrate having front and back main surfaces, and the at least one V-shaped groove having the reflecting surface formed over the front main surface of the substrate;

the light-emitting epitaxial layer over the substrate, wherein the peripheral region of the light-emitting epitaxial layer has the vertical projection between a bottom and an inner portion of the V-shaped groove, such that light emitted from the light-emitting epitaxial layer peripheral region is incident upon the reflecting surface of the V-shaped groove and reflected outwards.

14. The system of claim 13, wherein an optical path of the light emitted from the peripheral region of the light-emitting epitaxial layer is adjusted by the V-shaped groove.

15. The system of claim 14, wherein an angle between two side walls of the V-shaped groove is about 90 degrees such that light emitted at a vertical direction is reflected by the V-shaped groove and emits vertically after a parallel displacement outwards.

16. The system of claim 15, wherein: the V-shaped groove has a depth of about 5-20 μm.

17. The system of claim 13 wherein an angle between two side walls of the V-shaped groove is an obtuse angle such that light emitted at a vertical direction is reflected by the V-shaped groove and emits outwards, thereby expanding a light emitting angle.

18. The system of claim 17, wherein a reflecting structure is formed between the substrate and the light-emitting epitaxial layer, and wherein a vertical projection of the reflecting structure is at an inner side of the V-shaped groove.

19. The system of claim 18, wherein the reflecting structure is an omni-directional reflector comprising a low-refractivity dielectric layer and a metal reflecting layer.

* * * * *